(12) United States Patent
Sanjoh et al.

(10) Patent No.: US 7,402,208 B2
(45) Date of Patent: Jul. 22, 2008

(54) METHOD AND EQUIPMENT FOR PRODUCING BIOPOLYMER CRYSTAL

(75) Inventors: Akira Sanjoh, Kyoto-fu (JP); Nobuo Kamiya, Hyogo (JP); Takaaki Hikima, Hyogo (JP)

(73) Assignees: Protein Wave Corporation, Kyoto-Fu (JP); Riken, Saitama (JP)

( * ) Notice: Subject to any disclaimer, the term of this patent is extended or adjusted under 35 U.S.C. 154(b) by 597 days.

(21) Appl. No.: 10/360,852

(22) Filed: Feb. 10, 2003

(65) Prior Publication Data
US 2003/0159641 A1    Aug. 28, 2003

(30) Foreign Application Priority Data
Feb. 25, 2002   (JP)   .............................. 2002-047799

(51) Int. Cl.
*B01D 9/00* (2006.01)
(52) U.S. Cl. .................. 117/200; 117/201; 117/203; 117/206; 117/207; 117/901; 422/245.1
(58) Field of Classification Search ............... 117/200, 117/201, 203, 206, 207, 901; 422/245.1
See application file for complete search history.

(56) References Cited
U.S. PATENT DOCUMENTS

| | | | | |
|---|---|---|---|---|
| 4,919,899 A * | 4/1990 | Herrmann et al. | ........ | 422/245.1 |
| 5,643,540 A * | 7/1997 | Carter et al. | ............. | 422/245.1 |
| 5,873,394 A * | 2/1999 | Meltzer | ....................... | 141/130 |
| 6,039,804 A * | 3/2000 | Kim et al. | .................... | 117/206 |
| 6,319,315 B1 * | 11/2001 | Sanjoh | ........................ | 117/206 |
| 6,836,532 B2 * | 12/2004 | Durst et al. | .................... | 378/73 |
| 2003/0170146 A1 * | 9/2003 | Gilbert et al. | ................ | 422/100 |
| 2004/0079865 A1 * | 4/2004 | Hoshi | ....................... | 250/214.1 |

FOREIGN PATENT DOCUMENTS

| | | |
|---|---|---|
| JP | 10-158297 | 6/1998 |
| WO | WO93/07311 | 4/1993 |
| WO | WO 00/47323 | 8/2000 |

* cited by examiner

Primary Examiner—Yogendra N. Gupta
Assistant Examiner—Matthew J. Song
(74) Attorney, Agent, or Firm—McDermott Will & Emery LLP

(57) ABSTRACT

The invention provides a crystallizing method and an apparatus for producing a biopolymer capable of simplifying operations for taking out a produced crystal and mounting the crystal onto a crystal structure analyzer, thereby improving efficiency in the operations as well as reducing a labor burden. A crystallizing apparatus for producing a biopolymer crystal from a solution containing a biopolymer includes a crystal-growing chip 10 made of a material allowing electromagnetic waves to permeate through the chip, and in which a circular frame 16 is formed to retain a droplet 20 of a solution containing a biopolymer and a biopolymer crystal 28 produced in the droplet.

6 Claims, 11 Drawing Sheets

(d)

(e)

METHOD AND EQUIPMENT FOR PRODUCING BIOPOLYMER CRYSTAL

BACKGROUND OF THE INVENTION

1. Field of the Invention

The present invention relates to a crystallizing method for producing a biopolymer crystal, which is typically represented by a protein, and a crystallizing apparatus for use in implementing the method.

2. Background Art

Making clear a three-dimensional structure of a biopolymer, which is typically represented by a protein, not only enables to elucidate physiological functions in vivo of the biopolymer, but also is extremely useful from the viewpoint of achieving rational development of medicines (drug design). As a practical method for analyzing a three-dimensional structure of the biopolymer, an NMR (nuclear magnetic resonance) method and an X-ray crystal structure analysis method have been heretofore known. From the standpoint of analysis, the X-ray crystal structure analysis method in which there is no restriction in molecular weight of biopolymer is considered to be especially effective in the future. In this X-ray crystal structure analysis method, however, it is essential to prepare a single biopolymer crystal for conducting the required analysis. Moreover, to improve a resolution in the structure analysis, it is required to form a single crystal having a good crystallinity.

As a method for preparing a single biopolymer crystal, for example, a protein, a vapor diffusion method is commonly employed these days. In a sitting drop vapor diffusion method, as shown in FIG. 14, an aqueous solution 1 containing a small amount of protein of about 1 μl is dropped into a concave part 3 within a well solution retention plate 2 (in a hanging drop vapor diffusion method, an aqueous solution 1 containing a small amount of protein is dropped onto a surface being a lower face side of a cover glass 6 and adhered thereto). Further, a precipitant 5 is received in an inner bottom portion of a container-shaped concave part (well) 4, and a top opening of the container-shaped concave part 4 is closed tightly by the cover glass 6. In this manner, the aqueous solution 1 containing the protein comes to a supersaturated state due to evaporation of moisture in the course of time, and eventually a crystal 7 of protein is precipitated within the foregoing aqueous solution 1.

After obtaining the protein crystal 7, the crystal 7 is subject to analysis of crystal structure. For performing the crystal structure analysis, a diffraction intensity measurement of the crystal is conducted using an X-ray diffraction measurement apparatus. Therefore, it is required to take the crystal 7, which has grown in the aqueous solution 1, out of the concave part 3 of the well solution retention plate 2. For this purpose, in one of prior arts, first as shown in FIG. 15(a), the protein crystal 7 is picked up from within the concave part 3 along with a part of the aqueous solution 1 with the use of a tool 8 equipped with a nylon ring, which is generally referred to as a nylon loop (of which diameter is approximately 1 mm or less). Normally, this operation is carried out manually under a microscope. As shown in FIG. 15(b), the protein crystal 7 is held along with the aqueous solution 1. Subsequently, although not shown, after moisture of the aqueous solution 1, which is retained within the ring of the tool 8, is substituted by a defrost, the tool 8 holding the protein crystal 7 and the defrost 1' is mounted into a mounting tube 9. Then, the defrost 1' is quickly frozen in order to protect the crystal 7 and, thereafter, as shown in FIG. 15(c), the protein crystal 7, which is held within the ring of the tool 8, is irradiated with an X-ray to carry out measurement of a diffraction intensity.

To produce a biopolymer crystal being typically represented by a protein and to conduct an X-ray diffraction measurement of the obtained crystal, the above-mentioned method has been heretofore commonly utilized. In this conventional method, when the protein crystal 7 has grown within the aqueous solution 1, to provide the foregoing crystal 7 for conducting an X-ray crystal structure analysis, it is necessary to take each individual crystal 7 out of the concave part 3 of the well solution retention plate 2, and further mount the crystal 7 into the dedicated mounting tube 9. However, since this operation is normally carried out manually, several problems exist in that in the case of conducting the crystal structure analysis of a great deal of protein crystal, this operation is extremely inefficient and requires a lot of time as well as a larger amount of labor of an operator.

Additionally, in a method utilizing a heterogeneous nucleation in which method a crystal nuclear of a protein is formed and grown on a surface of a solid substrate, the crystal grows in the state of being adsorbed onto the surface of the solid substrate. Accordingly, in the case where the crystal has grown up to be a large size of crystal, because entire lower face of the crystal is adhered to the substrate, a further problem exists in that the crystal is broken and cracked therein at the time of taking out the crystal, eventually making it impossible to subject the crystal to the crystal structure analysis.

SUMMARY OF THE INVENTION

The present invention was made in view of the above-mentioned situations and has an object of providing a crystallizing method for producing a biopolymer, in which when subjecting a crystal, which has been produced, to a crystal structure analysis, operations for taking the crystal out of a crystal production place and mounting the crystal onto a crystal structure analyzer are simplified to improve efficiency of the operations as well as reduce a labor burden of the operator, and which is capable of automating the operations of taking out and mounting the crystal as well. The invention also has an object of providing a crystallizing apparatus capable of preferably implementing the crystallizing method.

The invention according to claim 1 provides a crystallizing method for producing a biopolymer in which a droplet of a solution containing a biopolymer is retained on a retention member, and the solution is brought into a supersaturated state due to evaporation of a solvent from the droplet thereby producing a biopolymer crystal within the droplet, the method being characterized by including a step of producing the biopolymer crystal on the retention member, which is made of a material allowing electromagnetic waves to permeate therethrough, so that the biopolymer crystal may be subject to a crystal structure analysis together with the mentioned retention member. Thus, it becomes possible that the crystal is subject to the crystal structure analysis together with the retention member without taking the crystal out of the retention member after the crystallization.

As a result, operations for taking the crystal out of the crystal production place and mounting the crystal onto a crystal structure analyzer can be simplified at the time of subjecting the crystal to the crystal structure analysis after the crystal has been produced. Therefore, improvement in efficiency of the operations and reduction in labor of an operator can be achieved. Furthermore, it also comes to be possible to automate the operations for taking out and mounting the crystal. Consequently, the method according to this invention is particularly efficient in the case where it is necessary to quickly crystallize, e.g., a large amount of protein, conduct an X-ray diffraction measurement, and carry out a crystal structure analysis.

The invention according to claim 2 provides a crystallizing apparatus for producing a biopolymer crystal from a solution containing a biopolymer, the apparatus being characterized by including a solution retention member, which is made of a material allowing electromagnetic waves to permeate therethrough, and in which a retention part is formed to retain a droplet of a solution containing a biopolymer and a biopolymer crystal produced in this droplet.

In the crystallizing apparatus of above constitution, the droplet of the solution containing a biopolymer is retained in the retention part of the solution retention member, and a solvent is evaporated from the droplet in such a state. Accordingly, a degree of supersaturation of the solution containing the biopolymer comes to be high, and the biopolymer crystal is precipitated and grown in the droplet. In this case, note that the solution retention member is made of the material allowing electromagnetic waves to permeate therethrough. Therefore, once the crystal has grown in the retention part of the solution retention member, it becomes possible that the crystal is subject to the crystal structure analysis together with the solution retention member without taking the crystal out of the retention member after the crystallization.

As a result, the method according to claim 1 of the invention can be preferably implemented, and the above-mentioned advantages can be obtained.

The invention according to claim 3 provides the crystallizing apparatus as defined in claim 2, and in which the retention part of the mentioned solution retention member is a circular frame.

As a result, the droplet of the solution containing a biopolymer is retained within the circular frame of the solution retention member, and the droplet of the solution containing the biopolymer is reliably retained on the solution retention member.

The invention according to claim 4 provides the crystallizing apparatus as defined in claim 3, the apparatus being characterized in that a plurality of mentioned circular frames are formed in the mentioned solution retention member.

As a result, screening test for searching crystallization conditions of the biopolymer can be conducted efficiently.

The invention according to claim 5 provides the crystallizing apparatus as defined in any of claims 2 through 4, the apparatus being characterized in that an auxiliary solution retention member is attached to the mentioned solution retention member, at least a part of the mentioned auxiliary solution retention member possessing affinity for the solution containing a biopolymer, and a part or whole of the mentioned auxiliary solution retention member being dipped in the droplet on the retention part of the mentioned solution retention member.

As a result, since an affinity portion or the whole of the auxiliary solution retention member is dipped in the droplet on the retention part of the solution retention member, the droplet is retained stably in the retention part of the solution retention member due to interfacial tension between the affinity portion of the auxiliary solution retention member and the droplet owing to good wettability of the affinity portion of the auxiliary solution retention member.

The invention according to claim 6 provides the crystallizing apparatus as defined in claim 3 or 4, the apparatus being characterized in that at least one auxiliary solution retention member of a conic configuration is disposed at en edge portion of the mentioned circular frame so that respective end portions may slightly protrude from an inner edge of the circular frame to be directed to a center of the circular frame, the mentioned at least one auxiliary solution retention member including a hydrophilic end portion, a circumferential surface of the mentioned at least one auxiliary solution retention member being hydrophobic, and at least the end portion of the mentioned at least one auxiliary solution retention member being dipped in the droplet on the retention part of said solution retention member.

As a result, since the hydrophilic end portion of the auxiliary solution retention member is dipped in the droplet within the circular frame of the solution retention member, the droplet is stably retained within the circular frame of the solution retention member due to interfacial tension between the droplet and the hydrophilic end portion of the auxiliary solution retention member owing to good wettability of the hydrophilic end portion of the auxiliary solution retention member.

The invention according to claim 7 provides the crystallizing apparatus as defined in any of claims 2 through 6, and in which an extending part for mounting the mentioned solution retention member onto a mounting part of a crystal structure analyzer is formed on the mentioned solution retention member.

As a result, it is possible to mount easily the solution retention member onto the mounting part of the crystal structure analyzer by, e.g., inserting the extending part, which is formed on the solution retention member, into the mounting part of the crystal structure analyzer.

The invention according to claim 8 provides the crystallizing apparatus as defined in any of claims 2 through 7, the apparatus being characterized in that a grip is formed on the mentioned solution retention member so that gripper means of a carrier may support the solution retention member when the solution retention member is carried by the carrier or that a gripping tool may support the solution retention member when the mentioned solution retention member is manually carried.

In the crystallizing apparatus of above constitution, the grip formed on the solution retention member is gripped by the gripper means of the carrier, or gripped by the gripping tool, thereby enabling the solution retention member to be supported easily as well as exactly.

As a result, it comes to be possible to automate transportation of the solution retention member using a carrier, or to carry out a manual transportation of the solution retention member without fail.

The invention according to claim 9 provides a crystallizing method for producing a biopolymer, in which a biopolymer crystal is produced within a droplet of a solution containing a biopolymer, the method being characterized by including the steps of receiving a droplet of the solution containing the biopolymer in a permeable pore provided in a retention plate, inserting a support member into the permeable pore from a lower surface side of the retention plate, supporting the droplet of the solution containing the biopolymer received within the permeable pore and the biopolymer crystal produced within the droplet by the mentioned support member, and pulling the mentioned support member out of the permeable pore of the retention plate, whereby the biopolymer crystal produced within the droplet is taken out. Thus, it comes to be possible that the crystal supported on the support member is subject to the crystal structure analysis as it is.

As a result, operations for taking the crystal out of the retention plate and mounting the crystal onto the crystal structure analyzer can be simplified at the time of subjecting the crystal to the crystal structure analysis after the crystal has been produced. Therefore, improvement in efficiency of the operations and reduction in labor of an operator can be achieved. Furthermore, it also comes to be possible to automate the operations for taking out and mounting the crystal. Consequently, the method according to this invention is particularly efficient in the case where it is necessary to quickly crystallize, e.g., a large amount of protein, conduct an X-ray diffraction measurement, and carry out a crystal structure analysis.

The invention according to claim 10 provides a crystallizing apparatus for producing a biopolymer, in which a biopolymer crystal is produced from a solution containing the biopolymer, the apparatus being characterized by including: a solution retention plate in which a plurality of permeable pores for receiving droplet of the solution containing the biopolymer are provided; and a plurality of solution support members that are inserted into each of the mentioned permeable pores of the mentioned solution retention plate from a lower surface side of the solution retention plate to support respectively the droplet of the solution containing the biopolymer received in each permeable pore and the biopolymer crystal produced within the mentioned droplet, and to take respective crystals of the biopolymer produced within the droplet out of each permeable pore of the solution retention plate.

In the crystallizing apparatus of above constitution, the droplet of the solution containing the biopolymer is received in each permeable pore of the solution retention plate, as well as supported by each solution support member inserted into the permeable pore of the solution retention plate from the lower surface side of the solution retention plate. Under such a state, a biopolymer crystal is precipitated and grown. After the crystal has been produced within each permeable pore of the solution retention plate, the biopolymer crystal is taken out of the permeable pore of the solution retention plate in the state of being supported on the solution support member by pulling the solution support member out of the permeable pore of the solution retention plate. It is possible that the crystal, which has been taken out of the permeable pore of the solution retention plate in the state of being supported on the solution support member, is subject to the crystal structure analysis.

As a result, the foregoing method of the invention according to claim 9 can be preferably implemented, and the above-mentioned advantages can be obtained.

The invention according to claim 11 provides the crystallizing apparatus as defined in claim 10, the apparatus being characterized in that the permeable pore of the mentioned solution retention plate has such a configuration as to mutually communicate, in an internal part of the solution retention plate, two concave parts respectively formed into a cone-shape from an upper surface and lower surface of the solution retention plate, and the mentioned solution support member is entirely formed into a conical shape so as to fit in the concave part on the lower surface side of the permeable pore of the mentioned solution retention plate, with a top end portion being hydrophilic and a circumferential surface being hydrophobic.

In the crystallizing apparatus of above constitution, the droplet of the solution containing the biopolymer is received in the concave part on the upper surface side of the permeable pore of the solution retention plate, as well as supported with the hydrophilic top end portion of the solution support member inserted in the concave part on the lower surface side of the permeable pore of the solution retention plate. When the crystal grows in the concave part on the upper surface side of the solution retention plate, the biopolymer crystal is taken out of the permeable pore of the solution retention plate in the state of being supported on the top end portion of the solution support member by pulling the solution support member out of the concave part on the lower surface side of the permeable pore of the solution retention plate.

As a result, the droplet of the solution containing the biopolymer can be reliably retained in the permeable pore of the solution retention plate, as well as the biopolymer crystal can be easily taken out of the permeable pore of the solution retention plate.

The invention according to claim 12 provides the crystallizing apparatus as defined in claim 10 or 11, the apparatus being characterized in that the mentioned solution support member is provided with an extending part for mounting the mentioned solution support member onto a mounting part of the crystal structure analyzer.

As a result, it is possible to easily mount the solution support member onto the mounting part of the crystal structure analyzer by, e.g., inserting the extending part formed on the solution support member into the mounting part of the crystal structure analyzer.

DESCRIPTION OF THE PREFERRED EMBODIMENTS

Several preferred examples according to the present invention are hereinafter described referring to FIGS. 1 through 13.

Figure 1:
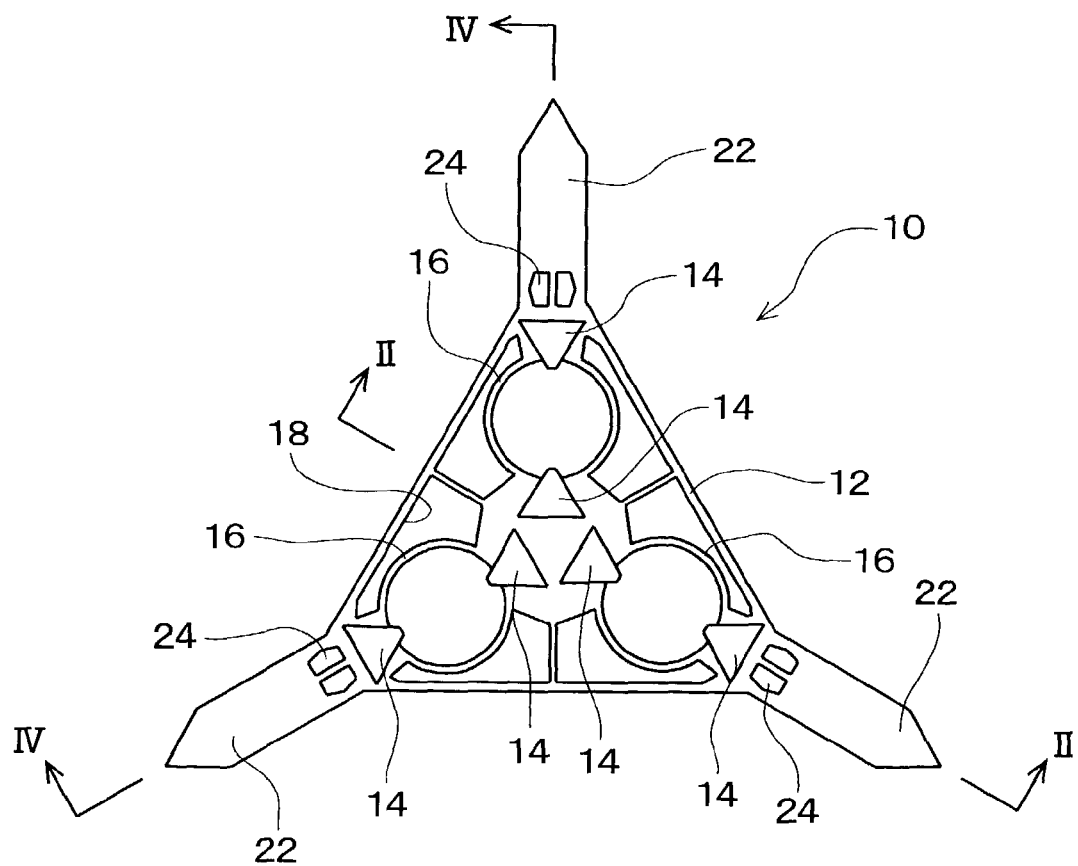
FIG. 1 shows one preferred example of the present invention, and is an enlarged plan view showing a crystal-growing chip that constitutes an essential part of a crystallizing apparatus used in order to produce a crystal of protein.
Figure 2:
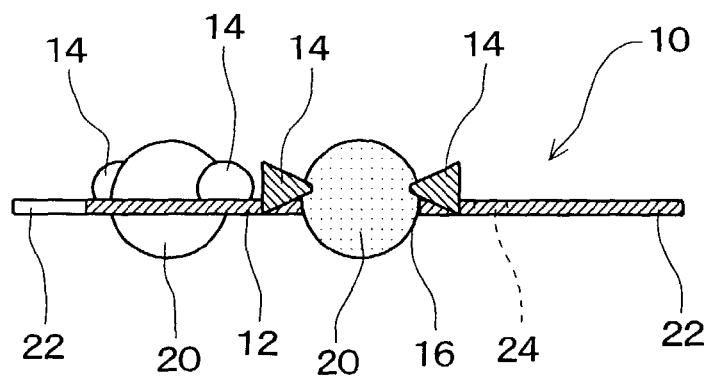
FIG. 2 is a longitudinally sectional view taken along the line II—II in a direction indicated by arrows, and shows a state of retaining a droplet of an aqueous solution containing a protein.

With reference to FIGS. 1 and 2, a crystal-growing chip 10 is composed of a chip body 12 that has a plate shape and retains a droplet of an aqueous solution containing a protein, and an auxiliary solution retention member 14 (hereinafter, simply referred to as "auxiliary member 14") that has such a configuration as a laying circular cone and assists the droplet to be retained stably in the chip body 12.

The chip body 12 is triangle-shaped, and plural (three in this example) hollow circular frames 16 are formed in the chip body 12. Most portions except for the parts forming the circular frame 16 are openings 18. The circular frame 16 is capable of retaining a droplet 20 of a very small amount of an aqueous solution containing a protein. Further, the openings 18 act so as to accelerate evaporation of moisture from the droplet 20 retained in the circular frame 16 and to cause the aqueous solution containing the protein to reach quickly a supersaturated state, increasing a degree of supersaturation. A supersaturation degree of the aqueous solution containing the protein can be adjusted by setting a total area of the openings 18 appropriately.

Further, three extending parts 22 are integrally formed so as to extend respectively from each apex of the triangle. Each extending part 22, as described later, acts as an insert to be inserted into a mounting tube at the time of mounting the crystal-growing chip 10 into the mounting tube of an X-ray diffraction measurement apparatus. Furthermore, pickup through holes 24 are provided respectively in the vicinity of a base portion of each extending part 22 through the chip body 12. Each pickup through hole 24 acts as a grip in order to be held the crystal-growing chip 10 with a pair of tweezers (pincette) or a robot arm when the crystal-growing chip 10 is supported, carried and mounted into the mounting tube of the X-ray diffraction measurement apparatus manually or by an automated apparatus. Unless required particularly, it is not always necessary that the chip body 12 be provided with either one or both of these extending part 22 and pickup through hole 24.

The chip body 12 is made of a material allowing electromagnetic waves to permeate, and particularly formed of a material of a high permeability with respect to a wavelength region of an X-ray. In inorganic compounds, organic compounds and high polymers, there are materials satisfying such conditions respectively. However, from the viewpoint of possessing properties of resistance to water, resistance to acid and resistance to alkali, a small coefficient of thermal expansion, and superiority in machining performance at the time of manufacturing, it is preferable to employ a high polymer and a high polymer film. More specifically, a polyimide film satisfies the above-mentioned conditions eventually resulting in the most preferable material.

In addition, a size of the chip body 12 mainly depends on droplet amount of an aqueous solution retained on the chip body 12 at the time of crystallizing a protein, and on size of a receptacle for receiving and accommodating the crystal growing chip 10. Generally, however, it is preferable that the chip body 12 is approximately 0.01 mm–1.00 mm in thickness and approximately 1.0 mm–10.0 mm in overall size. Such chip body 12 can be manufactured by, for example, wet etching.

The auxiliary member 14 acts so as to prevent the droplet 20 from dropping down out of the chip body 12 when an aqueous solution containing a protein is dropped onto the chip body 12 causing the droplet 20 to be retained within the circular frame 16. This auxiliary member 14, as shown in the enlarged perspective view of FIG. 3, possesses a conic configuration such that end and bottom there of maybe formed in a flat surface. Hydrophilic properties are given to a flat surface 14a of the end, while hydrophobic properties are given to a circumferential surface 14b. At least one auxiliary member 14 (a pair of auxiliary members 14 in this example) is attached sidewise to the edge portion of the circular frame 16 of the chip body 12 so that the end portions may be opposite to each other, as well as respective end portions may protrude slightly beyond an inner edge of the circular frame 16 to be directed to a center of the circular frame 16. Thus, as shown in FIG. 2, the end portion (or the whole) of the auxiliary member 14 is dipped in the droplet 20 retained within the circular frame 16 of the chip body 12, whereby the droplet 20 comes to be stably retained by each end portion having good wettability and an inner circumferential surface of the circular frame 16. The reason why the circumferential surface 14b of the auxiliary member 14 is made hydrophobic is to prevent an excessive amount of droplet of the aqueous solution from being adsorbed to the auxiliary member 14 at the time of crystallizing a protein. To retain the droplet 20 within the circular frame 16 of the chip body 12, it is sufficient that only the flat surface 14a of the end portion of the auxiliary member 14 is hydrophilic. Furthermore, in the case of attaching a plurality of auxiliary members 14 to an edge portion of the circular frame 16 of the chip body 12, it is preferable that various types of auxiliary members 14 of, e.g., different materials are used in combination for crystallizing a protein.

Although any of inorganic compounds, organic compounds and high polymers maybe employed as a hydrophilic material forming the flat surface 14a of the end portion of the auxiliary member 14, it is preferable that the material resistant to acid and alkali, to corrosion and to water is employed. Inorganic compound and metal substance employed as such a material include SiO2, Si3N4, TiO2, Al2O3, MgO, SrTiO3, Au, Pt, Ti and the like. Further, organic and high polymer preferably employed as such a material includes a silicone resin, a fluorinated resin containing fluorine, a polystyrene resin, a polypropylene resin and the like, surfaces of which are made partially hydrophilic by a plasma processing.

Further, as a hydrophobic material forming a circumferential surface 14b of the auxiliary member 14, any material can be employed as far as the material is superior in resistance to acid and alkali, resistance to corrosion, resistance to water, and in micro-fabrication properties. For example, an inorganic compound and metal substance preferably employed as such a material includes Si, SiO2, Si3N4, TiO2, Al2O3, MgO, SrTiO3, Au, Pt, Ti and the like. Among them, when any of the materials except for Si is going to be used, it is necessary to apply a water repellent treatment to the surfaces thereof, thereby reforming the surfaces of the materials to be hydrophobic. Furthermore, organic and high polymer preferably employed as such a material includes the above-mentioned silicone resin, fluorinated resin containing fluorine, polystyrene resin, polypropylene resin and the like. When these materials are used, it is not necessary to reform the surfaces in properties.

The auxiliary member 14 is required to be optimum in size and configuration thereof so that X-ray may be applied only to a crystal of protein, which is obtained with the use of the crystal-growing chip 10, without shielding the X-ray when the crystal is irradiated with the X-ray. Accordingly, it is desirable to make a size of the auxiliary member 14 shown in FIG. 3 as small as possible. In addition, considering workability and fabrication accuracy at the time of manufacturing, for example, the flat surface 14a of the end portion of the auxiliary member 14 is preferably in the range of 1 μm to 100 mm in diameter d1 and, more preferably, 10 μm to 50 μm. On the other hand, the bottom flat surface of the auxiliary member 14 is preferably in a range of 0.1 mm to 2.0 mm in diameter d2 and, more preferably, 0.5 mm to 1.0 mm. Further, the auxiliary member 14 is preferably about 0.1 mm–2.0 mm in thickness d3 and, more preferably, about 0.2 mm–1.0 mm, although thickness d3 thereof is determined depending on an entire size of the crystal-growing chip 10 and an amount of a droplet of an aqueous solution retained on the chip body 12. The mentioned auxiliary member 14 can be manufactured by applying a wet etching or a blast etching method.

Figure 4:
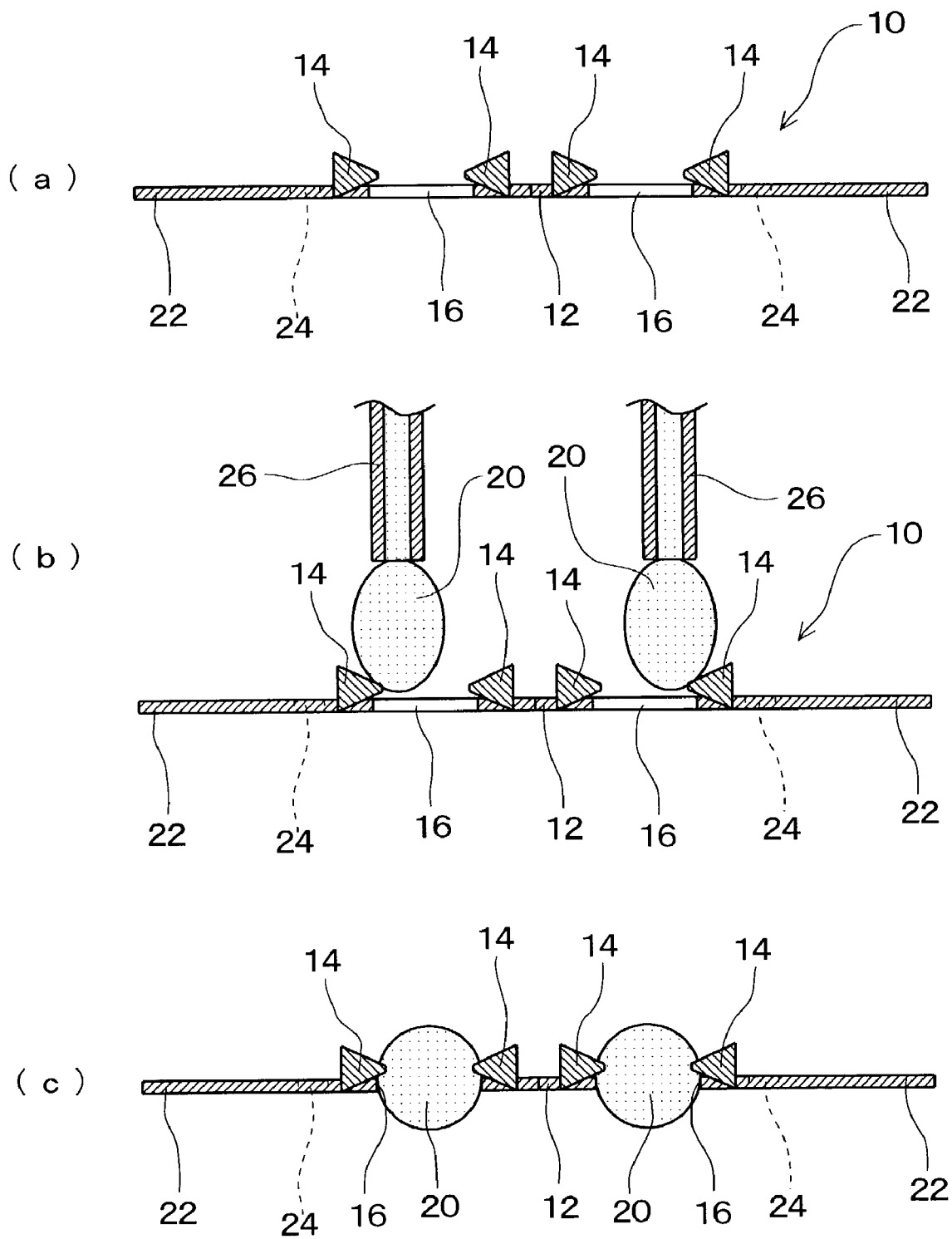
FIGS. 4(*a*), (*b*) and (*c*) are views for explaining a method for producing a crystal of protein with the use of the crystal-growing chip shown in FIGS. 1 and 2, and are longitudinally sectional views taken along the line IV—IV of FIG. 1 in a direction indicated by arrows running through a center position of the crystal-growing chip respectively.
Figure 5:
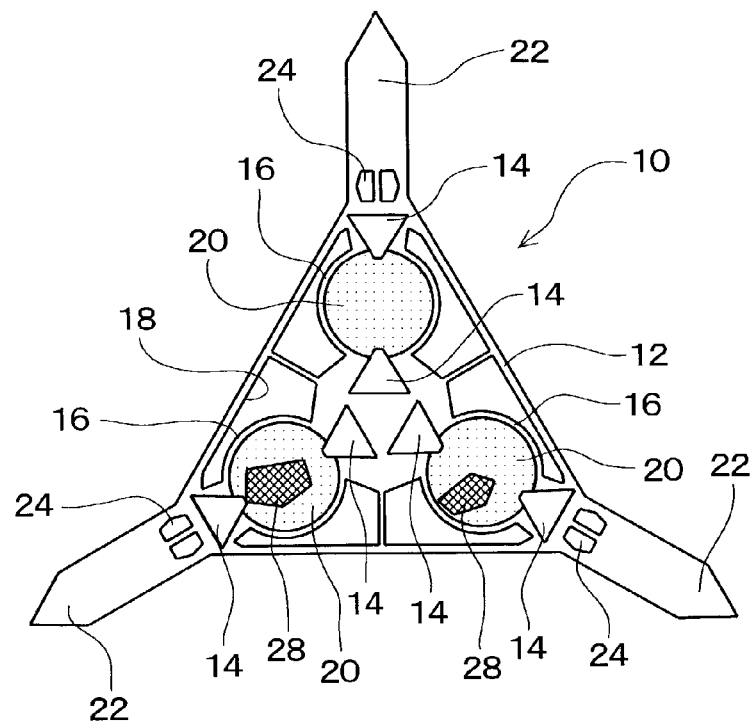
FIG. 5 is also a view for explaining a method for producing a crystal of protein, and is an enlarged plan view of the crystal-growing chip.

Now, a method for crystallizing a crystal of protein with the use of the crystal-growing chip 10 of the above-mentioned construction is described referring to FIGS. 4 and 5. In addition, FIGS. 4(a), (b) and (c) show respective longitudinally cross sectional views taken along the line IV—IV indicated by the arrows in a direction running through a center position of the crystal-growing chip 10 shown in FIG. 1.

A precipitant is dropped into a reservoir (well) within a well solution retention plate (not shown; see FIG. 14) for sitting drop, and the crystal-growing chip 10 shown in FIG. 4(a) is placed horizontally on the concave part within the plate. Then, as shown in FIG. 4(b), a droplet 20 of aqueous solution of a pre determined volume containing a protein is dropped into the circular frame 16 of the chip body 12 so that the droplet 20 may be in contact with the auxiliary member 14 with the use of a pipette 26. At this time, the droplet 20 is first brought into contact with the flat surface 14a (see FIG. 3) of the hydrophilic end portion of the auxiliary member 14 to be retained by the auxiliary member 14 due to surface wettability inherent in the flat surface 14a of the end portion of the auxiliary member 14. Thereafter, the droplet 20 is spread throughout the entire circular frame 16 due to surface tension of the circular frame 16 of the chip body 12, and is retained. Accordingly, as shown in FIG. 4(c), the droplet 20 is securely retained within the circular frame 16 of the chip body 12, thereby preventing the droplet 20 from dropping down from the chip body 12. Subsequently, a reaction reagent (the above-mentioned precipitant) is dropped into the circular frame 16 of the chip body 12 thereby mixing the aqueous solution containing the protein with the reaction reagent. Crystallization of the protein goes on by mixing the aqueous solution containing the protein with the reaction reagent so as to be in an appropriate mixture ratio. In FIG. 4, however, only the droplet 20 of aqueous solution containing the protein is shown. Then, the droplet 20 is increased in volume by mixing the reaction reagent into the aqueous solution containing the protein, and the whole of the droplet 20 comes to be retained within the circular frame 16 of the chip body 12. In this state, the crystallization of protein takes place.

Figure 6:
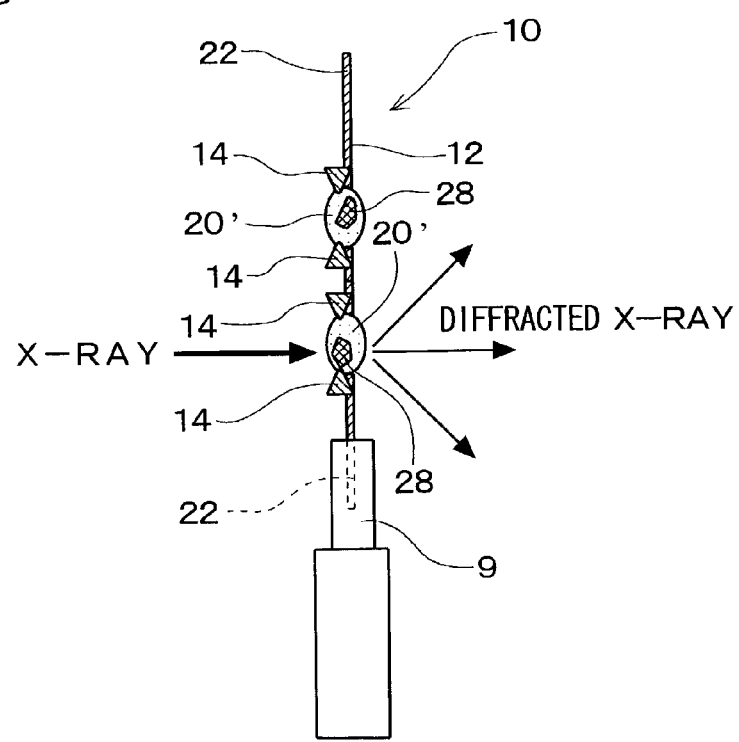
FIG. 6 is a longitudinally sectional view showing conditions of mounting a crystal of protein, which has been produced using the crystal-growing chip shown in FIGS. 1 and 2, onto a mounting tube of an X-ray diffraction measurement apparatus together with the crystal-growing chip to carry out the X-ray diffraction measurement of the crystal.

As shown in FIG. 5, the crystal 28 of the protein has been precipitated and grown within the droplet 20 retained in the circular frame 16 of the chip body 12, and thereafter the crystal 28 of protein is taken out of the plate along with the crystal-growing chip 10 manually with the use of a pair of tweezers or an automated apparatus provided with a robot arm though not shown. In this respect, some crystal nucleus of protein is formed incidentally within the droplet 20 (homogeneous nucleation), and others are formed on the flat surface 14a of the end portion of the auxiliary member 14 within the droplet 20 (heterogeneous nucleation). Then, although not shown, after moisture of the droplet 20 is substituted with defrost, the crystal-growing chip 10 is carried to an X-ray diffraction measurement apparatus. As shown in FIG. 6, one of the extending parts 22 of the chip body 12 is inserted into the mounting tube 9 of the X-ray diffraction measurement apparatus, whereby the crystal-growing chip 10 is mounted onto the mounting tube 9. Subsequently, the defrost 20' is quickly frozen in order to protect the crystal 28 on the crystal-growing chip 10, thereafter the crystal 28 of protein on the crystal-growing chip 10, which is mounted onto the mounting tube 9, is irradiated with an X-ray, and a diffraction intensity of the crystal 28 is measured to carry out a crystal structure analysis. At this time, although the chip body 12 is also irradiated with the X-ray, because the chip body 12 is made of material having a high permeability in a wavelength region of an X-ray, the X-ray applied to the chip body 12 permeates the chip body 12 as it is, and only the crystal 28 is irradiated with the X-ray. Accordingly, the X-ray diffraction measurement can be conducted with the crystal 28 of protein being held on the chip body 12.

Figure 7:
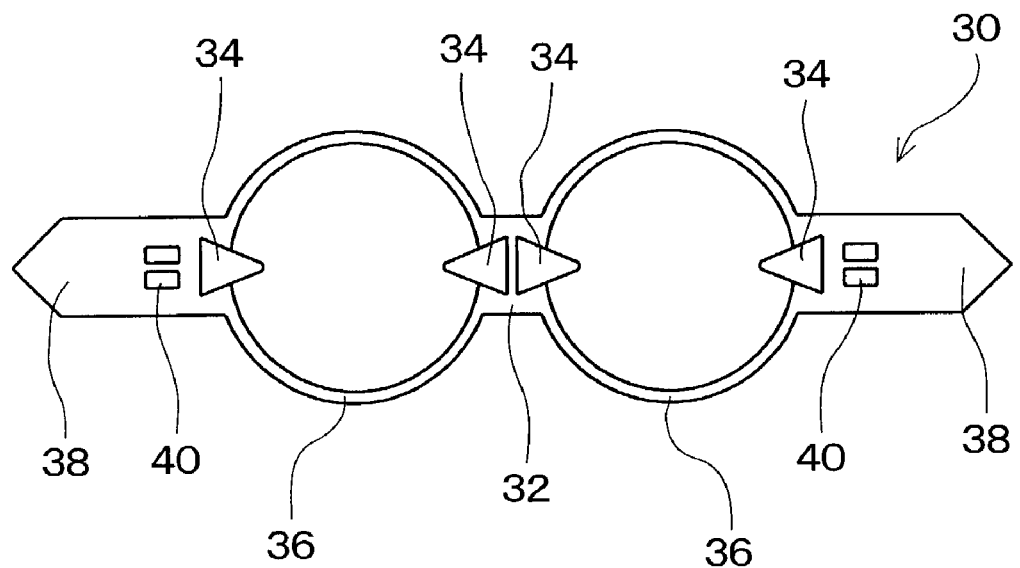
FIG. 7 shows another example of this invention, and an enlarged plan view of a crystal-growing chip constituting an essential part of the crystallizing apparatus.
Figure 8:
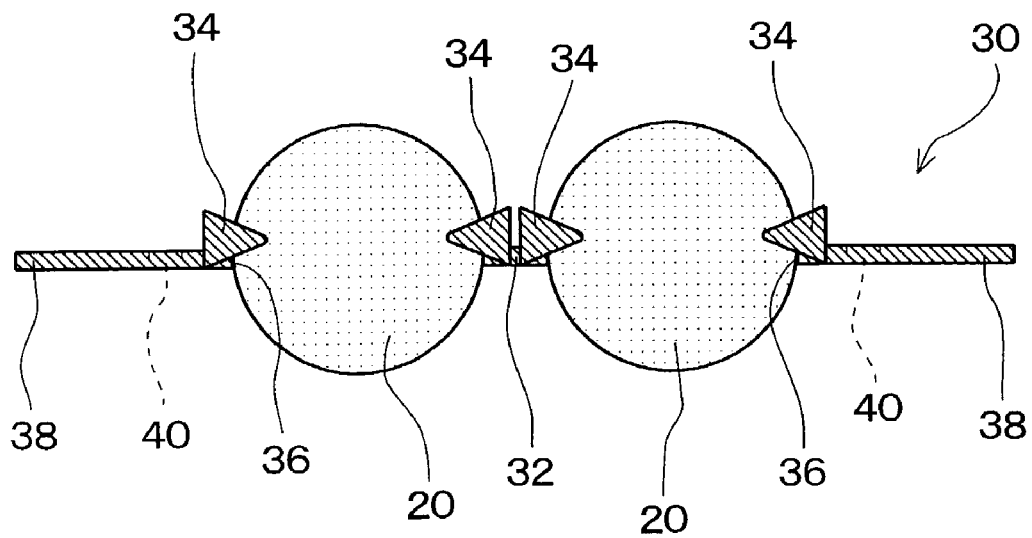
FIG. 8 is a longitudinally sectional view of the crystal-growing chip shown in FIG. 7, and a view showing a state of retaining a droplet of the aqueous solution containing the protein.

Next, with reference to FIGS. 7 and 8, a crystal-growing chip 30 is different from the above-mentioned crystal-growing chip 10 shown in FIGS. 1 and 2 only in configuration of a chip body 32. That is, the chip body 32 of this crystal-growing chip 30 is formed into an elongated plate-shape. Further, two hollow circular frames 36 are formed in parallel in the chip body 32, and the droplets 20 of an aqueous solution containing a protein are retained respectively in each of the circular frames 36. Further, a pair of extending parts 38 is integrally formed with the chip body 32 so as to extend respectively from each end of the chip body 32. This extending part 38 can be an insert at the time of mounting the crystal-growing chip 30 onto the mounting tube of the X-ray diffraction measurement apparatus. Furthermore, a pickup through hole 40 is provided in the vicinity of the base of each extending part 38. This pickup through hole 40 acts as a grip for being gripped by a pair of tweezers or robot arm.

Construction other than the above-mentioned configuration of the chip body 32 is the same as that of the foregoing crystal-growing chip 10. That is, a pair of auxiliary solution retention members 34 (hereinafter, simply referred to as "auxiliary member 34") that has such a configuration as a laying circular cone, is attached to an edge portion of the circular frame 36 of the chip body 32 in such a manner that end portions of the auxiliary member 34 may be opposite to each other, and respective end portions may slightly protrude from an inner edge of the circular frame 36 to be directed to the center of the circular frame 36. In addition, it is also preferable that either only one auxiliary member 34 is provided or not less than three auxiliary members 34 are provided. A detailed structure of the auxiliary member 34 is the same as that of the above-mentioned auxiliary member 14 shown in FIG. 3. Further, respective formation materials, sizes and functions of the chip body 32 and the auxiliary member 34 are also the same as those of the above-mentioned crystal growing chip 10. Furthermore, a method for producing a crystal of protein with the use of this crystal-growing chip 30 and a method for conducting an X-ray diffraction measurement of the produced crystal are also the same as in the foregoing case of using the above-mentioned crystal-growing chip 10. However, in the case of producing the crystal of protein with the use of this crystal-growing chip 30, it is possible to carry out the X-ray diffraction measurement of the crystal in a manner different from the above-mentioned X-ray diffraction measurement method. The different method is now described with reference to FIG. 10.

Figure 9:
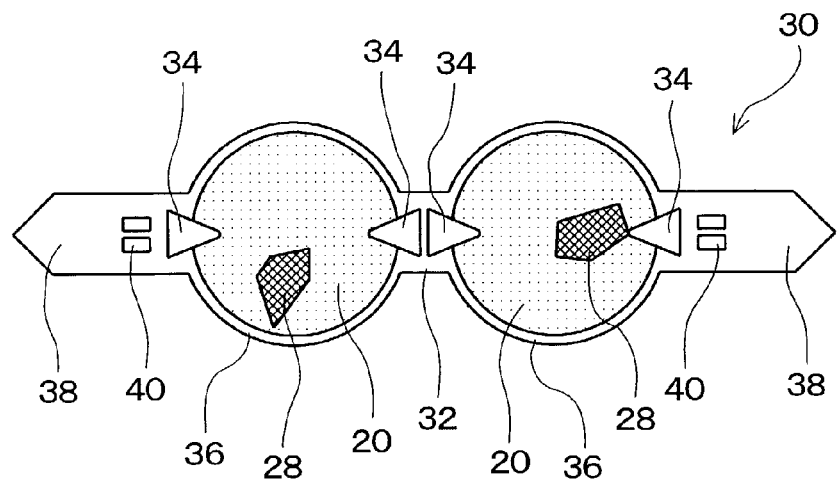
FIG. 9 is an enlarged planar view of the crystal-growing chip showing a state of producing a crystal of protein with the use of the crystal-growing chip shown in FIG. 7.
Figure 10:
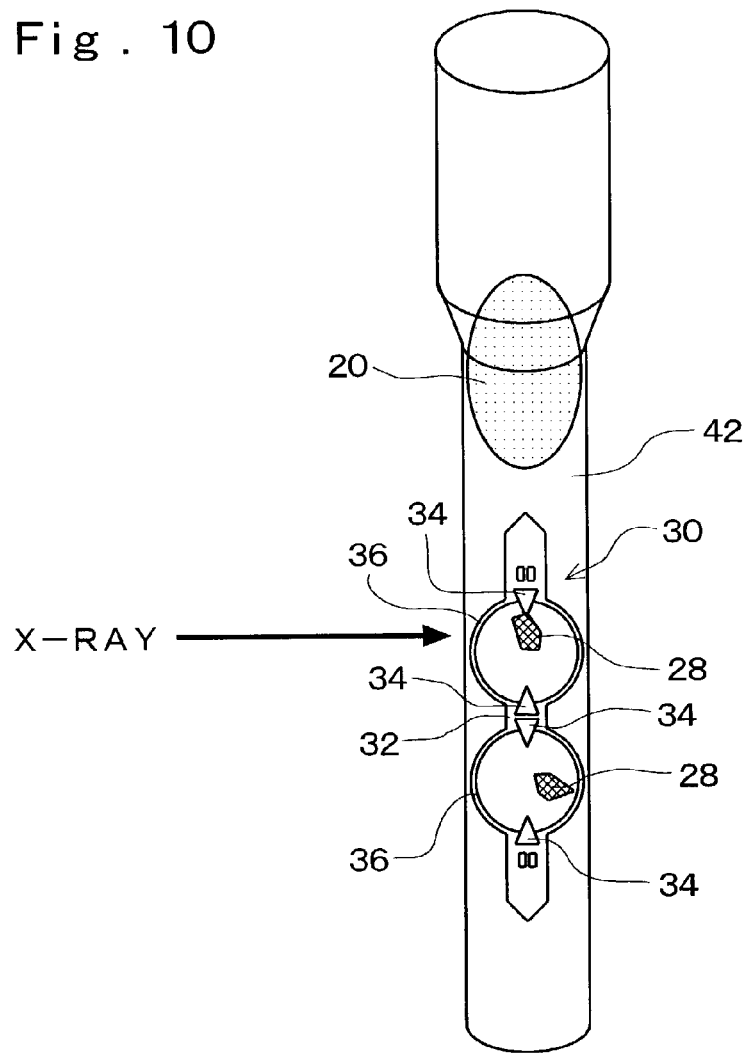
FIG. 10 is a schematic front view showing conditions of encapsulating a crystal of protein, which has been produced using the crystal-growing chip shown in FIG. 7, in a glass capillary of the X-ray diffraction measurement apparatus together with the crystal-growing chip to carry out the X-ray diffraction measurement of the crystal.

As shown in FIG. 9, when the crystal 28 of the protein has been precipitated and grown within the droplet 20 retained in the circular frame 36 of the chip body 32, the crystal 28 of protein is taken out of the plate together with the crystal-growing chip 30 manually with the use of a pair of tweezers or an automated apparatus provided with a robot arm. Then, as shown in FIG. 10, the crystal 28 of protein, which has been taken out together with the crystal-growing chip 30, is inserted and encapsulated in a glass capillary 42 having an inner diameter slightly larger than a width of the chip body 32. At this time, the droplet 20 is in contact with an inner wall surface of the glass capillary, thereby being separated from the circular frame 36 of the chip body 32 to remain on the top portion of the glass capillary 42. Thereafter, the crystal-growing chip 30 is further inserted into the innermost of the glass capillary 42, whereby the crystal 28 of protein can be loaded in the glass capillary 42 under the state of being held on the crystal-growing chip 30 as well as being separated from the droplet 20. Thus, when the crystal 28 of protein is loaded within the glass capillary 42, an X-ray is applied to the crystal 28 on the crystal-growing chip 30, and a diffraction intensity of the crystal 28 is measured to carry out a crystal structure analysis.

In addition, in each of the above-mentioned examples, the auxiliary members 14, 34 are attached to the chip bodies 12, 32 to form the crystal-growing chips 10, 30. However, on conditions that a droplet of an aqueous solution containing a protein or a reaction reagent is easily retained within the circular frames 16, 36 without dropping down from the circular frames 16, 36 of the chip bodies 12, 32 even if the crystal-growing chips 10, 30 are not provided with the auxiliary members 14, 34, it is not always required to provide the auxiliary members 14, 34. For example, the auxiliary members 14, 34 will not be necessary in the case of dropping an extremely small amount of aqueous solution of not more than 0.5 µl containing the protein onto the chip bodies 12, 32 to carry out crystallization of the protein, or in the case where the circular frames 16, 36 of the chip bodies 12, 32 made of a polyimide film are not more than 0.5 mm in diameter.

Now, an apparatus having a construction basically different from those of the crystallizing apparatus provided with the crystal-growing chips 10, 30 as mentioned above is described with reference to FIGS. 11 through 13.

Figure 11:
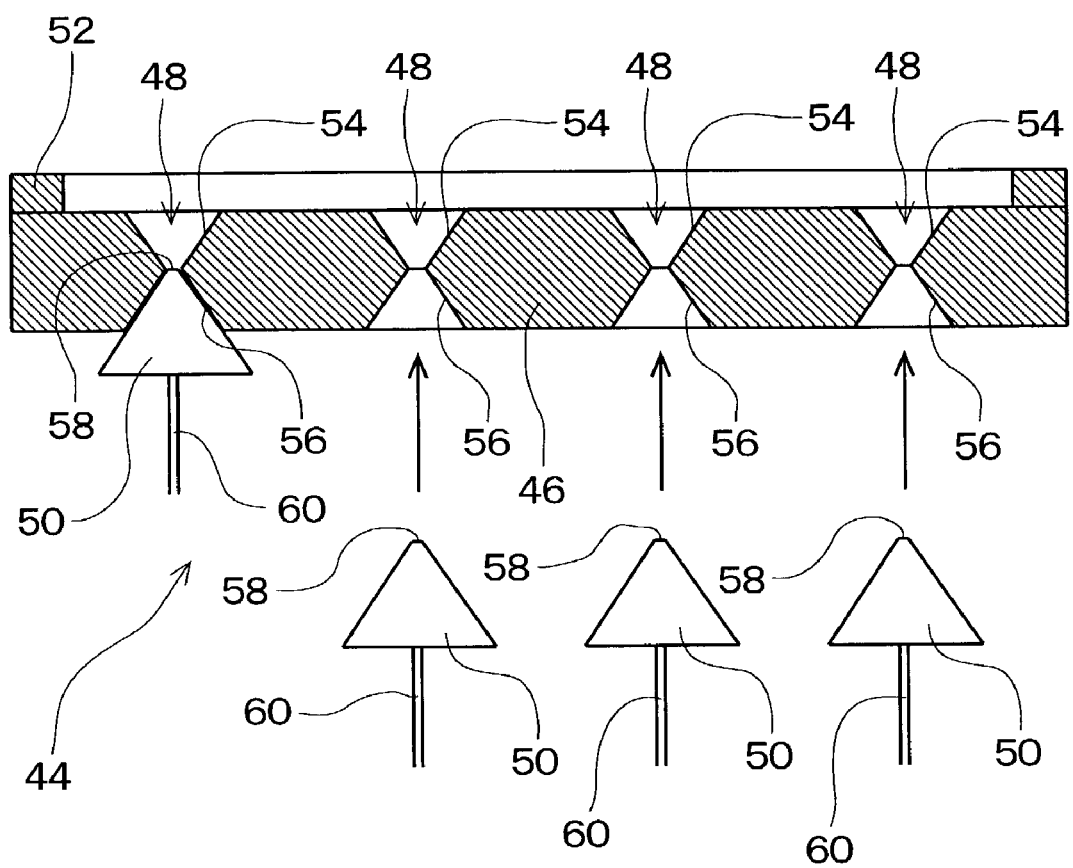
FIG. 11 shows a crystallizing apparatus including a basic construction different from that of the crystallizing apparatus provided with the crystal-growing chip shown in FIGS. 1 and 2 as well as in FIGS. 7 and 8 respectively, and an enlarged longitudinally sectional view of a crystal-growing unit forming an essential part of the crystallizing apparatus.

Referring to FIG. 11, a crystal-growing unit 44 is employed in a crystallization method called as a micro batch method in which oil is primarily used. With the use of this unit, operations of taking out a grown crystal of protein and mounting the crystal onto an X-ray diffraction measurement apparatus, subsequently conducted, are simplified, which results in a speedy crystal structure analysis. This crystal-growing unit 44 is comprised of a solution retention plate 46 in which a plurality of permeable pores 48 for receiving a droplet of an aqueous solution containing a protein, and solution support members 50 of the same number as number of the permeable pores 48.

A dam 52 is provided throughout a peripheral portion of the solution retention plate 46 on the upper surface side thereof. This dam 52 acts to prevent oil from getting down from an upper surface of the solution retention plate 46 at the time of dropping the oil on the upper surface side of the solution retention plate 46 as described later. The permeable pore 48 provided in the solution retention plate 46 possesses a configuration in such a manner as to communicate to each other two concave parts 54, 56, which are both bored in a mortar-shape from the upper and lower surfaces of the solution retention plate 46, at a central portion in a direction of thickness of the solution retention plate 46.

Figure 3:
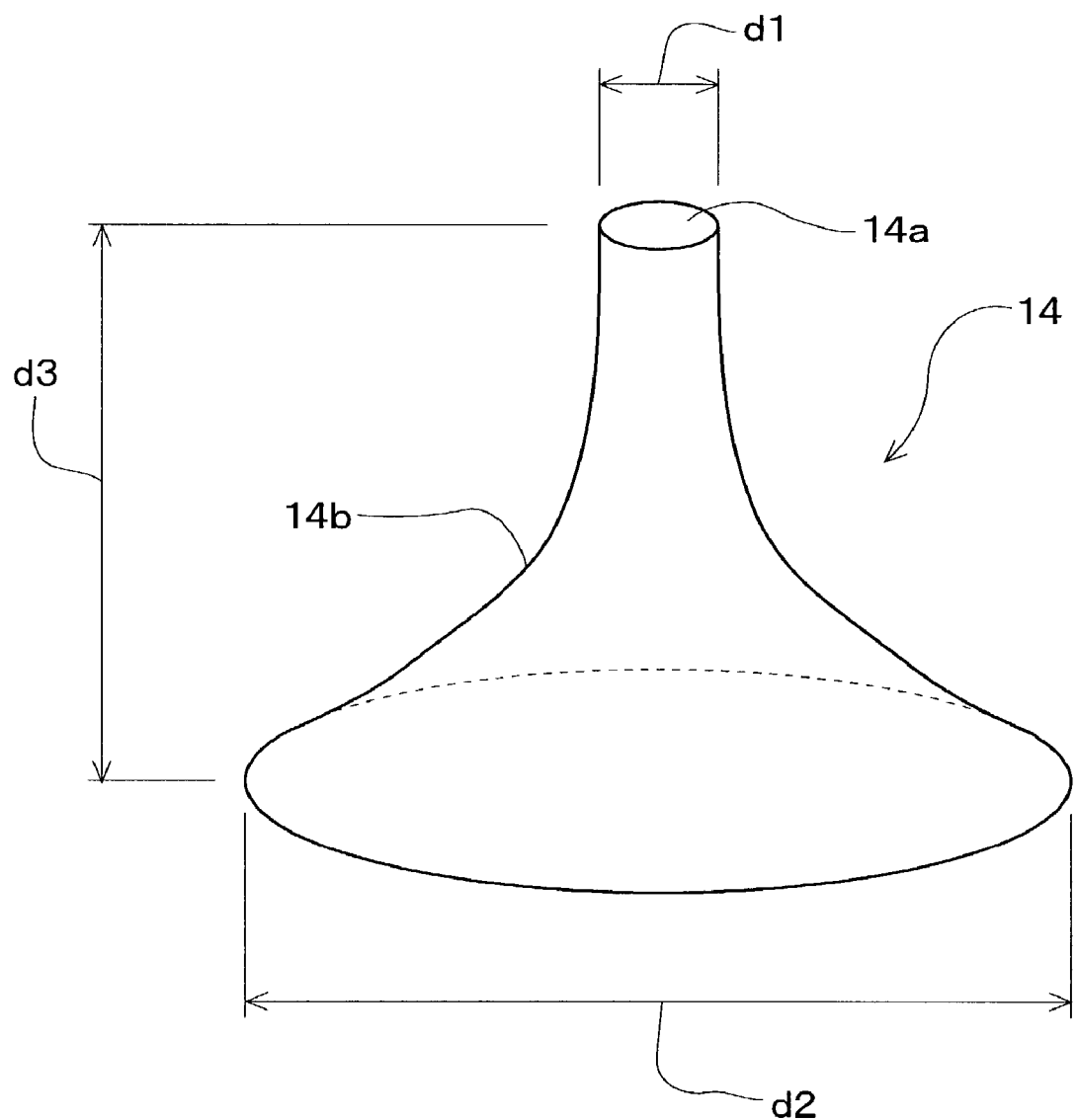
FIG. 3 is an enlarged perspective view showing an auxiliary solution retention member, which is an element of the crystal-growing chip shown in FIGS. 1 and 2.

The solution support member 50 possesses an entirely conic configuration so as to fit into a concave part 56 on the lower surface side of the permeable pore 48 of the solution retention plate 46 in the same manner as the auxiliary member 14 shown in FIG. 3. Further, the solution support member 50 includes at a top end portion thereof a solution support surface 58, which is formed into a flat surface and made hydrophilic, while a circumferential surface thereof is made hydrophobic. This solution support member 50 is, as described later, inserted into the permeable pore 48 of the solution retention plate 46 from the lower surface side of the solution retention plate 46 to support a droplet of an aqueous solution containing a protein received in a concave part 54 on the upper surface side. Further, the solution support member 50 also acts to support the crystal of protein produced within the droplet, and to take the crystal of protein, which has been produced within the droplet, out of the permeable pore 48 of the solution retention plate 46. Supposing that the solution support member 50 is capable of supporting any droplet of an aqueous solution containing a protein and a crystal of protein produced within the droplet without forming any top end portion of the solution support member 50 into a hydrophilic flat surface, it is not always required to form the solution support surface 58 is on the top end portion of the solution support member 50.

In addition, an extending part 60 is attached to a bottom surface side of the solution support member 50 so as to extend downward from a center position thereof. This extending part 60, as described later, acts as an insert to be inserted into a mounting tube at the time of mounting the solution support member 50 onto the mounting tube of the X-ray diffraction measurement apparatus. Further, it is preferable that the extending part 60 is previously attached to the solution support member 50, or attached to the bottom surface side of the solution support member 50 after conducting the crystallization of protein using the crystal-growing unit 44. Furthermore, it is also possible that a mounting tube itself, which is utilized at the time of a normal X-ray diffraction measurement, is used as an extending part.

The solution retention plate 46 can be made of any material of inorganic compound, organic compound and high polymer. A communication part (smallest diameter part) of the permeable pore 48 provided in the solution retention plate 46 is preferably in a range of 1 µm–100 µm in diameter and, more preferably, 2 µm–50 µm, although the diameter thereof is determined depending on a size of the solution support member 50 inserted into the permeable pore 48 from the lower surface side of the solution retention plate 46. Further, the solution retention plate 46 is preferably 0.1 mm–5.0 mm in thickness and, more preferably, 5 mm–2.0 mm.

In addition, as to size of the solution support member 50, the solution support surface 58 of the top end portion is preferably within the range of 1 μm–100 μm in diameter and, more preferably, in the range of 10 μm–50 μm. Further, a bottom flat surface of the solution support member 50 is preferably within the range of 0.1 mm–2.0 mm in diameter and, more preferably, within the range of 0.5 mm–1.0 mm. Furthermore, the solution support member 50 is preferably about 0.1 mm–2.0 mm in thickness and, more preferably, about 0.2 mm–1.0 mm, although it is determined depending on thickness of the solution retention plate 46.

Now, a method for producing a crystal of protein and subsequently carrying out an X-ray diffraction measurement of the crystal with the use of the crystal-growing unit 44 having the above-mentioned construction is hereinafter described with reference to FIGS. 12 and 13.

Figure 12:
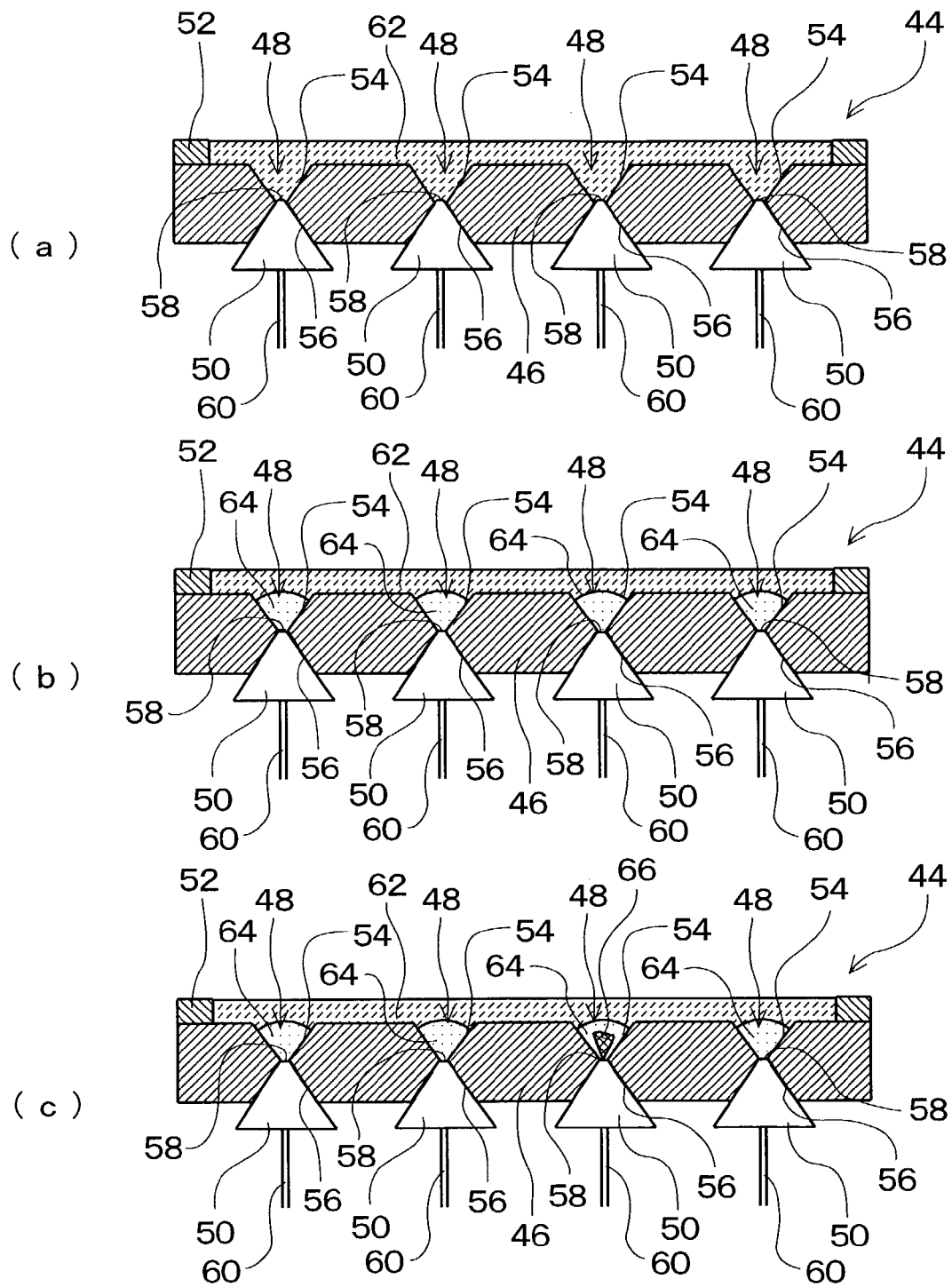
FIGS. 12(a), (b) and (c) are views each for explaining a crystallizing method for producing a crystal of protein with the use of a crystal-growing unit shown in FIG. 11, and are enlarged longitudinally sectional views of the crystal-growing unit.

As shown in FIG. 12(*a*), an oil 62 is dropped and pooled on an upper surface side of the solution retention plate 46 under the state in which the solution support member 50 is inserted into the permeable pore 48 of the solution retention plate 46 from the lower surface side of the solution retention plate 46. Then, as shown in FIG. 12(*b*), a droplet 64 of an aqueous solution containing a protein and a reaction reagent (only the droplet 64 of the aqueous solution containing the protein is shown, and the reaction agent is not shown in FIGS. 12 and 13) are dropped respectively by an appropriate amount into the concave part 54 on the upper surface side of the permeable pore 48 of the solution retention plate 46 to be mixed. Thereafter, conditions in the droplet 64 received in the concave part 54 on the upper surface side of the permeable pore 48 of the solution retention plate 46 are subject to observation.

Figure 13:
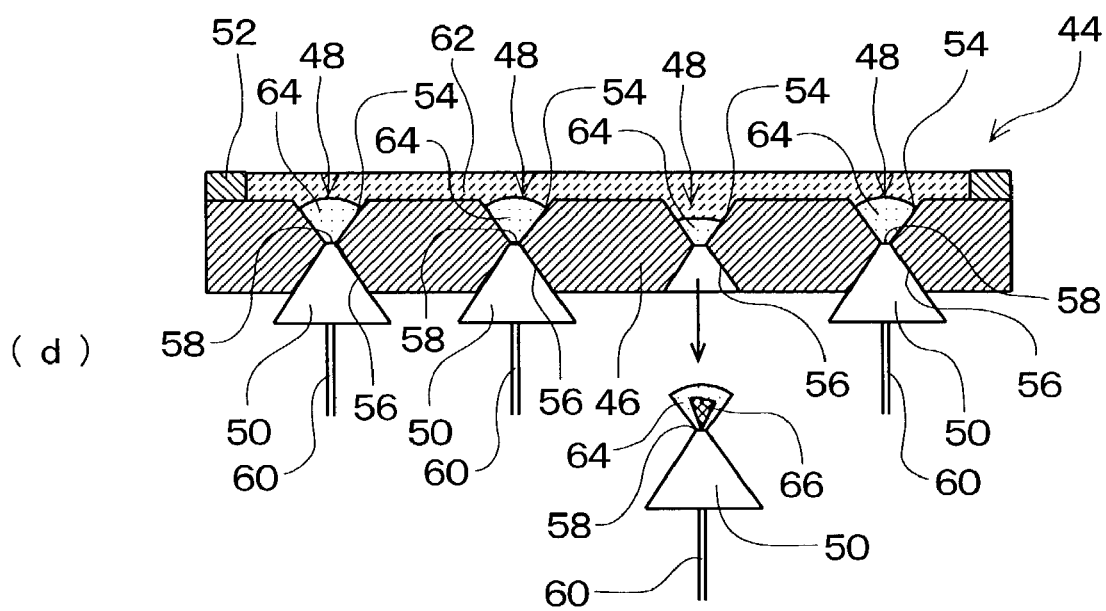
FIG. 13(d) is a view for explaining a method for producing a crystal of protein in the same manner as in FIG. 11, and is an enlarged longitudinally sectional view of the crystal-growing unit.
FIG. 13(e) is a longitudinally sectional view showing conditions of mounting the crystal of protein, which has been produced using the crystal-growing unit shown in FIG. 11, into the mounting tube of the X-ray diffraction measurement apparatus to carry out the X-ray diffraction measurement of the crystal.
Figure 13:
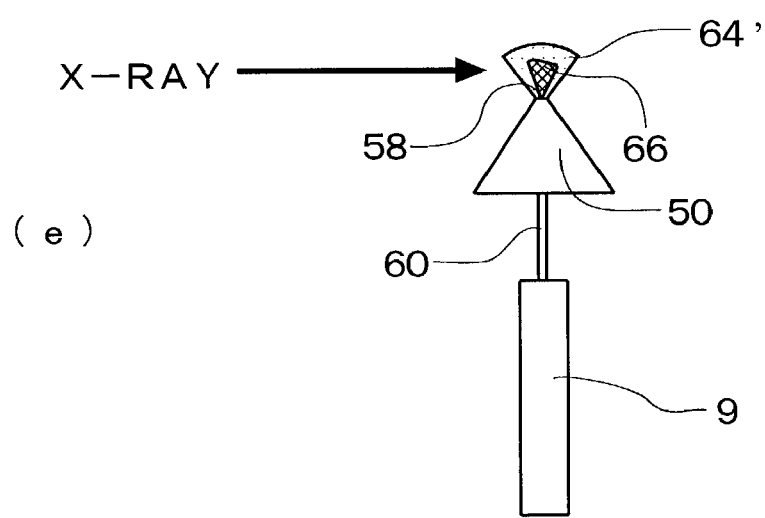

During the observation, when finding the permeable pore 48 at which a crystal 66 of the protein is precipitated and grown within the droplet 64 as shown in FIG. 12(*c*), only the solution support member 50 inserted in this permeable pore 48 is pulled out of the concave part 56 on the lower surface side of the permeable pore 48 of the solution retention plate 46 as sown in FIG. 13(*d*). At this time, when it is found that the crystal 66 of protein has grown on the surface of the solution support surface 58 of the solution support member 50, the crystal 66 of protein is taken out of the permeable pore 48 of the solution retention plate 46 along with the solution support member 50 at the time of pulling out the solution support member 50 from the lower surface of the solution retention plate 46. Then, a new solution support member 50 is loaded in the permeable pore 48 from which the solution support member 50 has been pulled out, there by making it possible to prevent the permeable pore 48 and others from leakage of the oil 62.

When the crystal 66 of the protein is taken out of the permeable pore 48 of the solution retention plate 46 along with the droplet 64 under the state of being supported on the solution support surface 58 of the solution support member 50, substitution of moisture of the droplet 64 for an anti-freezing (defrosting) agent 64' takes place although not shown. Thereafter, as shown in FIG. 13(*e*), the extending part 60 of the solution support member 50 is inserted into a mounting tube of an X-ray diffraction measurement apparatus to mount the solution support member 50 onto the mounting tube 9. Then, to protect the crystal 66 on the solution support member 50, the anti-freezing agent 64' is rapidly frozen, thereafter the crystal 66 of the protein on the solution support surface 58 of the solution support member 50 mounted to the mounting tube 9 is irradiated with the X-ray, and a diffraction intensity of the crystal 66 is measured to carry out a crystal structure analysis.

EXAMPLES

Hereinafter, more specific examples according to the invention are described showing experimental examples.

Manufacturing Example (1) of the Crystal-growing Chip

The crystal-growing chip 10 shown in FIGS. 1 and 2 was manufactured as follows.

A polyimide film of 50 μm in thickness was employed as a material, and the polyimide film was processed into a pattern shown in FIG. 1 by wet etching. Size of the chip body 12 was 7.0 mm in terms of a diameter of a circle corresponding to a contour thereof. Further, the circular frame 16 was 1.25 mm in diameter.

Next, the auxiliary member 14 was manufactured by the following three different methods ①, ②, ③.

① A CVD oxide film (SiO2) of 10 nm in thickness was formed on a surface of a P-type silicone substrate of 0.65 mm in thickness, and this thin plate material was processed into a configuration shown in FIG. 3 by wet etching (hereinafter referred to as "auxiliary member A"). The auxiliary member A was d1=35 μm, d2=850 μm, and d3=0.65 mm in dimension (see FIG. 3)

② A CVD oxide film (SiO2) of 100 nm in thickness was formed on a surface of a P-type silicone substrate of 0.65 mm in thickness, and subsequently a CDV nitride film (Si3N4) of 50 nm in thickness was formed on a surface of the CVD oxide film. This thin plate material was processed into a configuration shown in FIG. 3 by wet etching (hereinafter referred to as "auxiliary member B"). The auxiliary member B is d1=35 μm, d2=850 μm, and d3=0.65 mm in dimension.

③ A thin plate material of a sapphire crystal of 0.65 mm in thickness was processed into a configuration shown in FIG. 3 by blast etching. Then, a circumferential surface of the obtained member was dipped in a water-repellent solution thereby making only the circumferential surface hydrophobic (hereinafter referred to as "auxiliary member C"). The auxiliary member C was d1=30 μm, d2=900 μm, and d3=0.65 mm in dimension.

The obtained auxiliary members A, B, C were located and packaged as shown in FIG. 1 in the following combination so that two auxiliary members may be disposed respectively at each edge portion of the three circular frames 16 of the above-mentioned chip body 12:

The auxiliary member A and auxiliary member B: the circular frame provided with these auxiliary members is hereinafter referred to as "circular frame I".

The auxiliary member A and auxiliary member C: the circular frame provided with these auxiliary members is hereinafter referred to as "circular frame II".

The auxiliary member B and auxiliary member C: the circular frame provided with these auxiliary members is hereinafter referred to as "circular frame III".

Manufacturing Example (2) of the Crystal-Growing Chip

The crystal-growing chip 30 of the construction shown in FIGS. 7 and 8 was manufactured in the same manner as in the case of the above-mentioned crystal-growing chip 10. The chip body 32 was 7.0 mm in length. In addition, the circular frame 36 was 1.25 mm in diameter. Further, the auxiliary members A, B and C were located and packaged as shown in FIG. 7 in the following combination so that two auxiliary members may be disposed respectively at each edge portion of the two circular frames 36 of the chip body 32:

The auxiliary member A and auxiliary member B: the circular frame provided with these auxiliary members is hereinafter referred to as "circular frame i".

The auxiliary member A and auxiliary member C: the circular frame provided with these auxiliary members is hereinafter referred to as "circular frame ii".

Manufacturing Example of the Crystal-growing Unit

The crystal-growing unit 44 of the construction shown in FIG. 11 was manufactured in the following manner:

A heat-resistant glass substrate of 1.2 mm in thickness and 100 mm square was employed as a material, 96 permeable pores 48 of a cross sectional configuration shown in FIG. 11 were formed by drilling the glass substrate from both front and back faces with the use of an ultrasonic drill. Next, the whole of the glass substrate was subjected to a water repellent treatment, thereby obtaining the solution retention plate 46. As for size of the permeable pore 48, an opening thereof was 1.0 mm in diameter, and a communication part at a central portion in a direction of thickness of the solution retention plate 46 was 30 μm in diameter. In addition, the above-mentioned auxiliary member B was used as the solution support member 50. To hold the solution retention plate 46, a frame made of an acrylic resin of 5 mm in thickness and 10 mm in frame width was used, and the solution retention plate 46 was further placed thereon.

[Crystallization Test (1)]

An elastaze made from the bovine pancreas was dissolved into an ammonium acetate buffer solution of 0.1M in concentration and pH 4.6 so as to be 10 mg/ml in concentration, whereby an aqueous solution containing a protein was prepared. At the same time, NaCl was dissolved into an ammonium acetate buffer solution of 0.1M in concentration and pH 4.6 so that a resultant mixture thereof may be 1.5M in concentration, whereby a precipitant was prepared.

The crystal-growing chip 10, which was manufactured in accordance with the above-mentioned manufacturing example (1) of the crystal-growing chip (hereinafter, referred to as "chip I"), was placed on a plate for a sitting drop. 500 μl of the above-mentioned precipitant was dropped into a reservoir within the plate. Then, 1.0 μl of the above-mentioned aqueous solution containing the protein and precipitant were dropped respectively onto each of the three circular frames I, II and III of the chip I, and droplets were retained within the circular frames I, II and III. Crystallization tests were carried out on condition that the whole droplets were retained within the circular frames I, II and III for four days at a temperature of 20° C. Thereafter, when observing the droplets within the circular frames I, II and III of the chip I, the following results were obtained.

Circular frame I: A crystal of protein was grown in the vicinity of the auxiliary member A.

Circular frame II: A crystal of protein was grown in the vicinity of the auxiliary member A.

Circular frame III: Any growth of crystal was not observed.

[Crystallization Test (2)]

An elastaze made from the bovine pancreas was dissolved into an ammonium acetate buffer solution of 0.1M in concentration and pH 4.6 so as to be 10 mg/ml in concentration, whereby an aqueous solution containing a protein was prepared. At the same time, NaCl was dissolved into an ammonium acetate buffer solution of 0.1M in concentration and pH 4.6 so that a resultant mixture thereof may be 1.5M in concentration, whereby a precipitant was prepared.

The crystal-growing chip 30, which was manufactured in accordance with the above-mentioned manufacturing example (2) of the crystal-growing chip (hereinafter, referred to as "chip II"), was placed on a plate for a sitting drop. 500 μl of the above-mentioned precipitant was dropped into a reservoir within the plate. Then, 1.0 μl of the above-mentioned aqueous solution containing the protein and precipitant were dropped respectively onto each of the two circular frames i and ii of the chip II, and droplets were retained within the circular frames i and ii. Crystallization tests were carried out on condition that the whole droplets were retained within the circular frames i and ii for four days at a temperature of 20° C. Thereafter, when observing the droplets within the circular frames i and ii of the chip I, the following results were obtained.

Circular frame i: A crystal of protein was grown in the vicinity of the auxiliary member A.

Circular frame ii: A crystal of protein was grown in the vicinity of the auxiliary member A.

[Crystallization Test (3)]

An elastaze made from the bovine pancreas was dissolved into an ammonium acetate buffer solution of 0.1M in concentration and pH 4.6 so as to be 10 mg/ml in concentration, whereby an aqueous solution containing a protein was prepared. At the same time, NaCl was dissolved into an ammonium acetate buffer solution of 0.1M in concentration and pH 4.6 so that a resultant mixture thereof may be 1.5M in concentration, whereby a precipitant was prepared.

In the crystal-growing chip 44, which was manufactured in accordance with the above-mentioned manufacturing example of the crystal-growing unit (hereinafter, referred to as "unit"), respective auxiliary members B were inserted and loaded from the lower surface side of the solution retention plate 46 in each permeable pore 48 of the solution retention plate 46. Next, paraffin oil was poured onto an upper surface side of the solution retention plate 46 of the unit, whereby the permeable pores 48 of the solution retention plate 46 were entirely covered with the paraffin oil. Then, 0.5 μl of the above-mentioned aqueous solution containing the protein and the precipitant were respectively scaled out and mixed, and this mixture solution was dropped onto the solution retention plate 46, thus the droplet was received within each permeable pore 48. A crystallization test was carried out on condition that every droplet was retained within the permeable pores 48 of the solution retention plate 46 for four days at a temperature of 20° C. Thereafter, when observing the droplets within the permeable pores 48 of the solution retention plate 46, the crystal of protein was grown on the top portion of the auxiliary member B.

Subsequently, after securing the mounting tube to the bottom surface side of the auxiliary member B where growth of the crystal had been confirmed, the auxiliary member B was pulled out of the permeable pore 48 of the solution retention plate 46, and an X-ray diffraction measurement of the obtained crystal was carried out. In addition, at this time, a quick-drying adhesive was applied to a tip of the mounting tube thereby achieving immobilization of the auxiliary member B.

[Results of Crystallization and Crystal-mounting Operations]

Table 1 shows results of the crystallization test, maneuverability in taking out the chip I, II and the auxiliary member of the unit and mounting them onto the X-ray diffraction measurement apparatus, and feasibility in freezing the crystal and encapsulating the chip II into the capillary, together.

| | Appearance of grown crystal | Taking out and mounting chip/unit | Freezing/encapsulation in capillary |
|---|---|---|---|
| Chip I | Rod-like crystal | Good | Freezing: good |
| Chip II | Rod-like crystal | Good | Encapsulation in capillary: good |
| Chip III | Rod-like crystal | Good | Freezing: good |

In the case of the chip I and the auxiliary member B of the unit, it was possible to take out the grown crystal together with the chip I and the auxiliary member B of the unit, to carry out a solution substitution by the anti-freezing agent and freezing of the anti-freezing agent, and further to mount the grown crystal onto a goniometer. Furthermore, in the case of the chip II, it was possible to encapsulate the chip II in the glass capillary after taking it out. In addition, a time required for this operation was only five seconds.

Comparative Example

Figure 14:
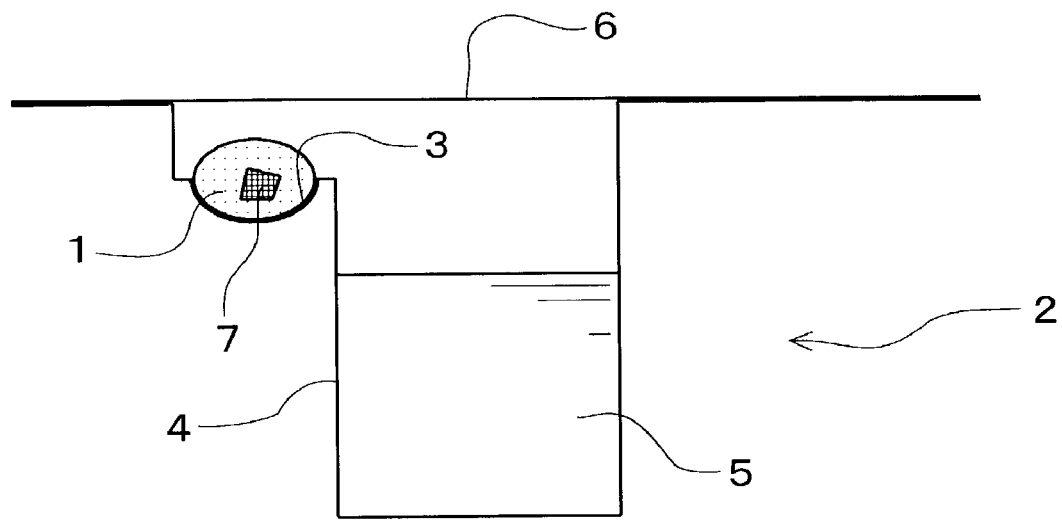
FIG. 14 is a schematic view for explaining a method for producing a single crystal of protein by a conventional sitting drop vapor diffusion method.
Figure 15:
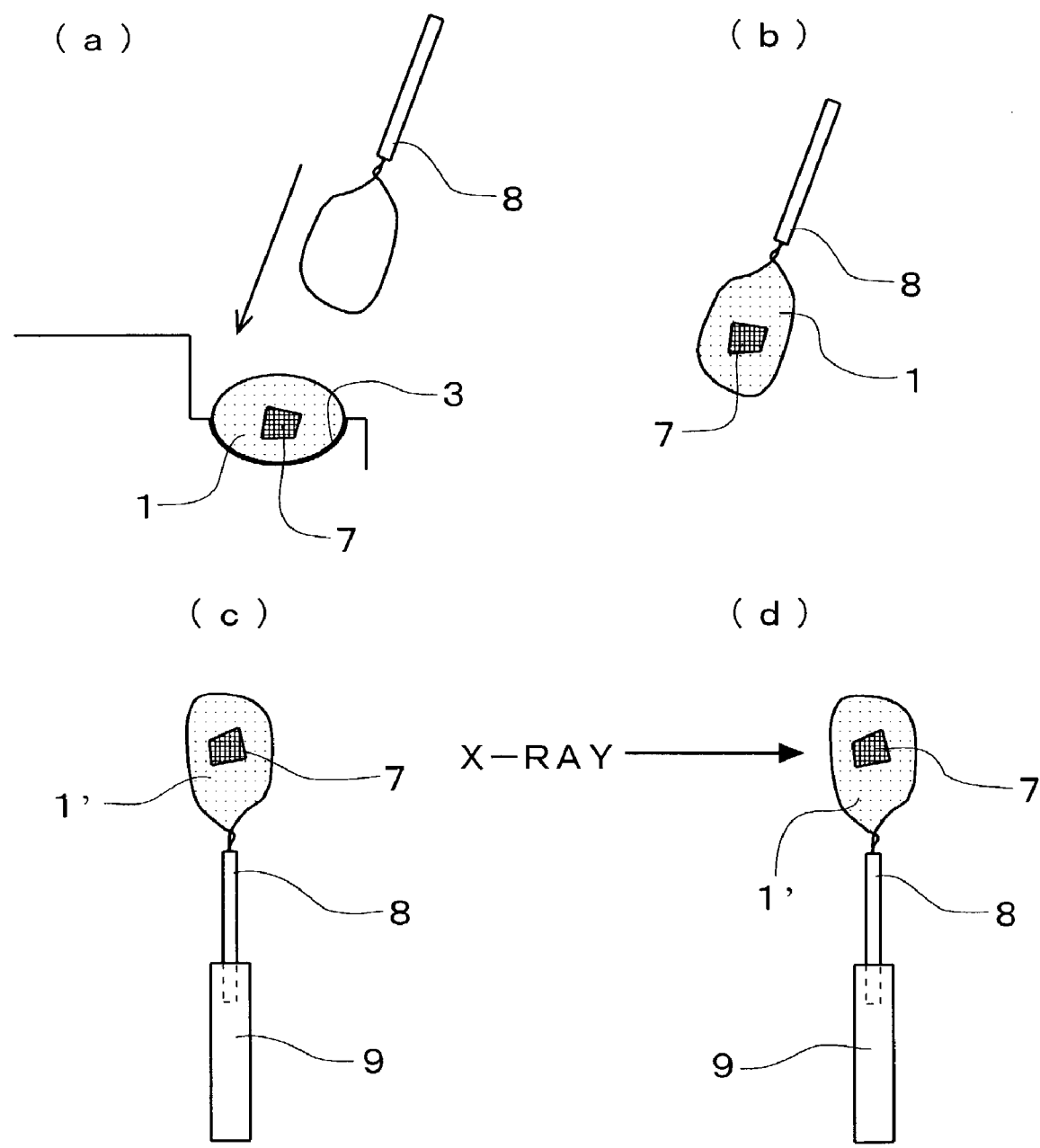
FIGS. 15(a), (b), (c) and (d) are schematic views each for explaining a method for producing a single crystal of protein as well.

A crystallization test was carried out in accordance with a conventional method (hanging drop vapor diffusion method) as shown in FIGS. 14 and 15, which was then compared with the crystallization test using the crystal-growing chip and the crystal-growing unit according to the invention. The crystallization test was carried out with the use of an equivalent protein-containing aqueous solution and a precipitant under the equivalent crystallization conditions to those in the case of the above-mentioned examples. Then, a grown crystal was taken out by means of a tool provided with a nylon loop while observing it with a microscope, and mounted onto the goniometer after substituting moisture thereof for an anti-freezing agent or encapsulating the grown crystal in the glass capillary. A time period required for these operations was 50 seconds on the average.

It is to be understood that the form of the invention herein shown and described is to be taken as a preferred example of the same and that various changes and modifications of the examples may be made without departing from the spirit and scope of the invention.

What is claimed is:

1. A crystallizing apparatus for producing a biopolymer crystal from a solution containing a biopolymer comprising a crystal-growing chip having a plate shape and is made of a material allowing electromagnetic waves to permeate therethrough, and in which a circular frame is formed to retain a droplet of a solution containing a biopolymer and a biopolymer crystal produced in said droplet;

wherein said crystal-growing chip is placed in a well solution retention plate for sitting drop, and after having grown a biopolymer crystal within the droplet retained in said circular frame, said crystal-growing chip is taken out of said well solution retention plate while the biopolymer crystal being retained in said circular frame and is provided for use in crystallography;

wherein a plurality of said circular frames are formed in said crystal growing chip; and wherein at least one auxiliary solution retention member of a conic configuration is disposed at an edge portion of said circular frame so that respective end portions may slightly protrude from an inner edge of the circular frame to be directed to a center of the circular frame, said at least one auxiliary solution retention member including a hydrophilic end portion, a circumferential surface of said at least one auxiliary solution retention member being hydrophobic, and at least the end portion of said at least one auxiliary solution retention member being dipped in the droplet on the retention part of said crystal growing chip.

2. The crystallizing apparatus for producing a biopolymer crystal according to claim 1 wherein an extending part for mounting said crystal growing chip onto a mounting part of a crystal structure analyzer is formed on said crystal growing chip.

3. The crystallizing apparatus for producing a biopolymer crystal according to claim 1, wherein a grip is formed on said crystal growing chip so that gripper means of a carrier may support the crystal growing chip when the crystal growing chip is carried by the carrier or that a gripping tool may support the crystal growing chip when said crystal growing chip is manually carried.

4. A crystallizing apparatus for producing a biopolymer, in which a biopolymer crystal is produced from a solution containing the biopolymer, the apparatus comprising:

a solution retention plate in which a plurality of permeable pores for receiving droplet of the solution containing the biopolymer are provided; and a plurality of solution support members that are inserted into each of said permeable pores of said solution retention plate from a lower surface side of the solution retention plate to support respectively the droplet of the solution containing the biopolymer received in each permeable pore and the biopolymer crystal produced within said droplet, and to take respective crystals of the biopolymer produced within the droplet out of each permeable pore of the solution retention plate.

5. The crystallizing apparatus for producing a biopolymer crystal according to claim 4, wherein the permeable pore of said solution retention plate has such a configuration as to mutually communicate, in an internal part of the solution retention plate, two concave parts respectively formed into a cone-shape from an upper surface and lower surface of the solution retention plate, and said solution support member is entirely formed into a conical shape so as to fit in the concave part on the lower surface side of the permeable pore of said solution retention plate, with a top end portion being hydrophilic and a circumferential surface being hydrophobic.

6. The crystallizing apparatus according to claim 4 or 5, wherein said solution support member is provided with an extending part for mounting the solution support member onto a mounting part of the crystal structure analyzer.

* * * * *